United States Patent
Fukazawa

(10) Patent No.: US 7,387,949 B2
(45) Date of Patent: Jun. 17, 2008

(54) SEMICONDUCTOR DEVICE MANUFACTURING METHOD, SEMICONDUCTOR DEVICE, LAMINATED SEMICONDUCTOR DEVICE, CIRCUIT SUBSTRATE, AND ELECTRONIC APPARATUS

(75) Inventor: Motohiko Fukazawa, Suwa (JP)

(73) Assignee: Seiko Epson Corporation (JP)

( * ) Notice: Subject to any disclaimer, the term of this patent is extended or adjusted under 35 U.S.C. 154(b) by 144 days.

(21) Appl. No.: 11/305,451

(22) Filed: Dec. 16, 2005

(65) Prior Publication Data

US 2006/0131713 A1 Jun. 22, 2006

(30) Foreign Application Priority Data

Dec. 21, 2004 (JP) .............................. 2004-369082

(51) Int. Cl.
*H01L 21/00* (2006.01)
(52) U.S. Cl. ....................... 438/460; 257/214
(58) Field of Classification Search ................ 438/460, 438/458
See application file for complete search history.

(56) References Cited

U.S. PATENT DOCUMENTS

| 6,603,191 | B2 | 8/2003 | Wakabayashi et al. |
| 6,653,731 | B2 | 11/2003 | Kato et al. |
| 2002/0163054 | A1* | 11/2002 | Suda ........................... 257/431 |
| 2004/0188822 | A1 | 9/2004 | Hara |
| 2005/0017338 | A1 | 1/2005 | Fukuzawa |
| 2005/0023669 | A1* | 2/2005 | Obinata ...................... 257/690 |
| 2005/0051883 | A1 | 3/2005 | Fukazawa |

FOREIGN PATENT DOCUMENTS

| JP | 2001-127206 | 5/2001 |
| JP | 2001/176898 | 6/2001 |
| JP | 2001-244281 | 9/2001 |
| JP | 2001-277689 | 10/2001 |
| JP | 2001-326299 | 11/2001 |
| JP | 2004/221349 | 8/2004 |
| JP | 2004-273525 | 9/2004 |
| JP | 2005-012023 | 1/2005 |
| JP | 2005-012024 | 1/2005 |

\* cited by examiner

*Primary Examiner*—Thao X. Le
*Assistant Examiner*—Elias Ullah
(74) *Attorney, Agent, or Firm*—Harness, Dickey & Pierce, P.L.C.

(57) ABSTRACT

A semiconductor device includes a semiconductor element, a penetrating electrode which penetrates the semiconductor element, and a resin layer which selectively covers side walls and corners of the semiconductor element.

5 Claims, 12 Drawing Sheets

SEMICONDUCTOR DEVICE MANUFACTURING METHOD, SEMICONDUCTOR DEVICE, LAMINATED SEMICONDUCTOR DEVICE, CIRCUIT SUBSTRATE, AND ELECTRONIC APPARATUS

CROSS-REFERENCE TO RELATED APPLICATION

This application claims priority to Japanese Patent Application No. 2004-369082, filed Dec. 21, 2004, the contents of which are incorporated herein by reference.

BACKGROUND

1. Technical Field

The present invention relates to a semiconductor device manufacturing method, a semiconductor device, a laminated semiconductor device, a circuit substrate, and an electronic apparatus.

2. Related Art

Recently, along with demands to reduce the size and weight of portable electronic apparatuses such as mobile telephones, note-type personal computers, and personal data assistants (PDAs), attempts are also being made to reduce the size of various electronic components, such as semiconductor devices, which are installed inside these electronic apparatuses. Accordingly, a three-dimensional mounting technique for semiconductor devices is proposed. Three-dimensional mounting is a technique of laminating semiconductor devices which have similar or different functions.

A semiconductor device for three-dimensional mounting should preferably by small and thin. A thin semiconductor device may for example be manufactured by the following method. A semiconductor wafer having a plurality of semiconductor devices disposed thereon is diced to a midway point, and the faces of the diced semiconductor wafer are covered with resin. The wafer is thinned by backgrinding and the thin semiconductor wafer is transferred to a dicing tape. After transferal to the dicing tape, it is separated into individual semiconductor devices (e.g., see Japanese Unexamined Patent Application, First Publication No. 2001-127206).

In this method, the thinness of the semiconductor wafer makes it liable to break, consequently making it difficult to handle when separating it into individual semiconductor devices e.g., when transferring the semiconductor wafer to the dicing tape.

There is another three-dimensional mounting technique of laminating a plurality of semiconductor devices, each having a semiconductor element whose two faces are covered with an insulating film and a penetrating electrode which penetrates through the semiconductor element, on top of each other (e.g., see Japanese Unexamined Patent Application, First Publication No. 2001-277689).

A semiconductor device with a penetrating electrode structure has lower strength (e.g., transverse rupture strength) than one which does not have such a structure, since a through-hole for forming the penetrating electrode can cause the semiconductor device to break. In particular, chips, cracks, and the like, in the semiconductor element are caused by dicing when a plurality of semiconductor devices on a semiconductor wafer are separated into individual devices. The chips reduce the strength of the semiconductor element, and the cracks spread toward the through-hole, making the semiconductor element liable to break. In other words, a semiconductor device which includes a penetrating electrode has a problem of low strength.

One technique for increasing the strength of the semiconductor device is to cover all the faces of the semiconductor element with a layer of resin (e.g., see Japanese Unexamined Patent Application, First Publication No. 2001-244281).

However, when all the faces of the semiconductor element are covered with an insulating film, it is difficult to strictly control the thickness of the insulating film. If the thickness of the insulating film is uneven, differences in the film stress may cause the semiconductor element to warp. This reduces the reliability of the semiconductor device.

SUMMARY

An advantage of some aspects of the invention is to provide a semiconductor device manufacturing method, a semiconductor device, a laminated semiconductor device, a circuit substrate, and an electronic apparatus, which can increase the strength of a semiconductor element including a penetrating electrode structure.

A semiconductor device manufacturing method according to an aspect of the invention includes: affixing a semiconductor wafer, which includes a plurality of semiconductor element sections which a conductive material is buried in, to a supporting body via an adhesive layer; forming a penetrating electrode which penetrates the plurality of semiconductor element sections and has the conductive material, by thinning the semiconductor wafer; cutting the semiconductor wafer so that the supporting body remains, and dividing the semiconductor wafer into the plurality of semiconductor element sections; forming a resin layer which selectively covers side walls and corners of the plurality of semiconductor element sections formed by cutting the semiconductor wafer; and peeling the semiconductor element sections from the supporting body.

In accordance with an embodiment of the invention, side walls and corners of the semiconductor element sections formed by cutting the semiconductor wafer are selectively covered by the resin layer, reinforcing the side walls and the corners. Therefore, chips or cracks which are generated in the side walls and the corner when the semiconductor wafer is cut can be prevented from spreading, and the strength of the semiconductor elements can be increased.

It is preferable that a configuration be adopted in which, the forming of the resin layer has the steps of applying resin in selective regions on the semiconductor wafer which include gaps between the plurality of semiconductor elements formed by cutting the semiconductor wafer, and splitting the resin which is buried in the gaps.

This enables the resin layer which covers the side walls and the corners of the semiconductor element sections to be easily formed.

In this case, the step of the splitting of the resin should preferably be executed by exposing and developing the resin layer which consists of a positive photosensitive resin.

This enables the resin in the gaps between the plurality of semiconductor element sections to be easily split.

It is preferable that a configuration be adopted in which, the resin layer additionally covers the periphery of the penetrating electrode in the semiconductor element sections.

In comparison with a case where the resin layer covers the entire semiconductor wafer, this reduces the contraction pressure when the resin layer is hardened and lightens the load on the semiconductor elements.

It is preferable that a configuration be adopted in which, in the peeling the semiconductor element sections, ultraviolet rays which reduce the adhesion of the adhesive layer should be applied to the adhesive layer.

This enables the semiconductor device to be easily peeled from the supporting body, and makes it easy to separate the semiconductor device. The semiconductor device according to an aspect of the invention includes a semiconductor element, a penetrating electrode which penetrates the semiconductor element, and a resin layer which selectively covers the semiconductor element.

In accordance with an embodiment of the invention, since the side walls are selectively covered by the resin layer, chips or cracks which are generated in the side walls at the time of separating the semiconductor device are prevented from spreading, and the strength is thereby increased.

It is preferable that a configuration be adopted in which, the resin layer also selectively covers the corners of the semiconductor element.

Since the resin layer selectively covers the corners of the semiconductor device, chips which are generated in the corners at the time of separation are prevented from spreading, and the strength is thereby increased.

It is preferable that a configuration be adopted in which, the penetrating electrode protrudes from an active face and a rear face of the semiconductor element, and the resin layer additionally and selectively covers the periphery of the penetrating electrode on the rear face of the semiconductor element.

In comparison with a case where the resin layer covers the entire semiconductor wafer, this reduces the contraction pressure when the resin layer is hardened and lightens the load on the semiconductor element.

A laminated semiconductor device according to an aspect of the invention includes a plurality of the semiconductor devices described above, the plurality of semiconductor devices being laminated together.

In accordance with an embodiment of the invention, the high strength of the semiconductor device increases the reliability.

A circuit substrate according to an aspect of the invention includes the abovementioned semiconductor device and the abovementioned laminated semiconductor device.

In accordance with an embodiment of the invention, superior strength and high reliability can be obtained.

An electronic apparatus according to an aspect of the invention includes the abovementioned circuit substrate.

In accordance with an embodiment of the invention, superior strength and high reliability can be obtained.

DESCRIPTION OF EXEMPLARY EMBODIMENTS

A semiconductor device manufacturing method, a semiconductor device, a laminated semiconductor device, a circuit substrate, and an electronic apparatus will be explained.

Firstly, a manufacturing method of a semiconductor device 1 according to an embodiment of this invention will be explained. In this explanation of the manufacturing method of the semiconductor device 1, a semiconductor wafer which is used in manufacturing the semiconductor device 1 will be explained.

Figure 1:
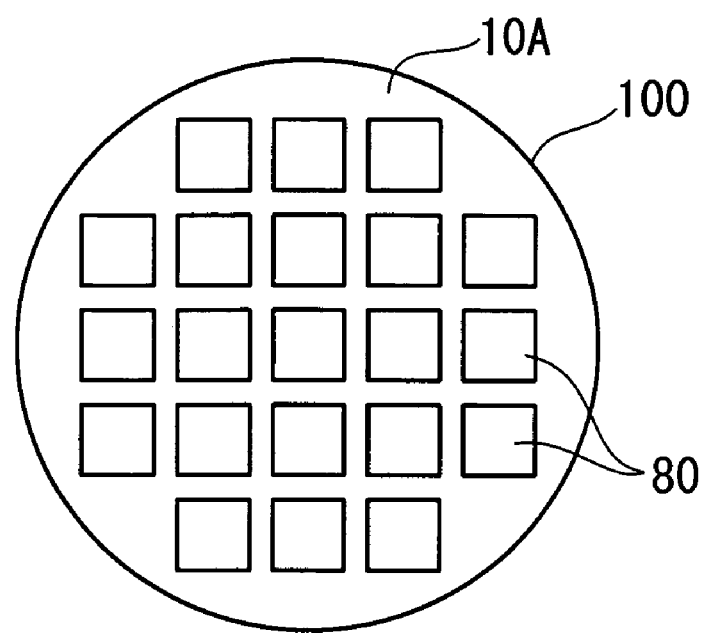
FIG. 1 is a plan view of a semiconductor wafer used in manufacturing a semiconductor device.

FIG. 1 is a plan view of a silicon wafer (semiconductor wafer) 100 consisting of, for example, silicon (Si), which is used in manufacturing the semiconductor device 1. A plurality of semiconductor element sections 80 are provided on the active face 10A of the silicon wafer 100. Penetrating electrodes are disposed in the semiconductor element sections 80 in a step described below. When the silicon wafer 100 is cut, the semiconductor element sections 80 become semiconductor devices 1 including semiconductor elements 10 (see FIGS. 11A and 11B). The semiconductor elements 10 include element substrates including drive circuits and the like.

Electronic circuits (not shown) consisting of a transistor, a memory element, other electronic elements, electrical interconnections, an electrode pad, and the like, are formed on the active face 10A of each semiconductor element section 80. These electronic circuits are not formed on a rear face 10B (see FIG. 2) on the opposite side to the active face 10A.

FIGS. 2A to 2E are schematic representations of steps of burying a conductive section in the semiconductor element section 80 during the manufacturing method of the semiconductor devices 1 of this embodiment. FIGS. 3A to 6B are steps of forming the conductive section, being cross-sectional views of a top face section of the semiconductor element section 80. FIGS. 7A to 7C are steps of exposing part of a penetrating electrode. Steps of forming a penetrating electrode 12 on the semiconductor element section 80 will be explained using FIGS. 2A to 7C.

Figure 3A:
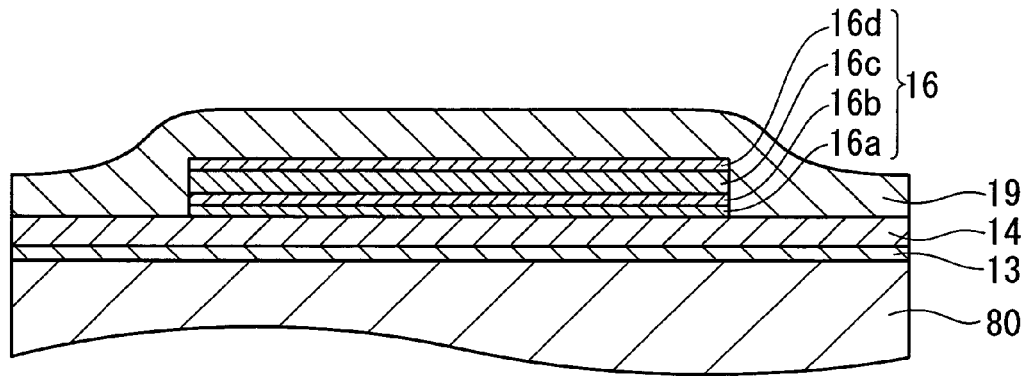
FIGS. 3A to 3C show steps of forming a conductive section.

Firstly, as shown in FIG. 3A, an insulating film 13 of $SiO_2$ and an interlayer insulating film 14 of BoroPhosphoSilicate glass (BPSG) are sequentially disposed on the semiconductor element section 80 in the silicon wafer 100.

An electrode pad 16 is then formed on one part of the interlayer insulating film 14. The electrode pad 16 is formed by sequentially laminating a first layer 16a of titanium (Ti), a second layer 16b of titanium nitride (TiN), a third layer 16c of aluminum/copper (AlCu), and a fourth layer (cap layer) 16d of TiN. The electrode pad 16 is electrically connected at an unillustrated point to the electronic circuits formed on the active face 10A of the semiconductor element sections 80. While in this embodiment no electronic circuits are formed below the electrode pad 16, the present invention is not limited to this.

The electrode pad 16 is formed by, for example, sputtering the laminated structure consisting of the first layer 16a to the fourth layer 16d over the entire face of the interlayer insulating film 14, and patterning it into a predetermined shape (e.g., a circle) by using a resist or the like. While this embodiment describes an example where the electrode pad 16 is formed by the laminated structure, it may be formed by a single-layer structure consisting only of copper which has low electrical resistance. The electrode pad 16 is not limited to this configuration, and may be modified as appropriate in accordance with the electrical, physical, and chemical characteristics that are required.

A passivation film 19 is formed on the interlayer insulating film 14 and covers part of the electrode pad 16. The passivation film 19 consists of silicon oxide ($SiO_2$), silicon nitride (SiN), polyimide resin, etc. Preferably, the $SiO_2$ is laminated on the SiN, or vice versa.

Figure 2A:
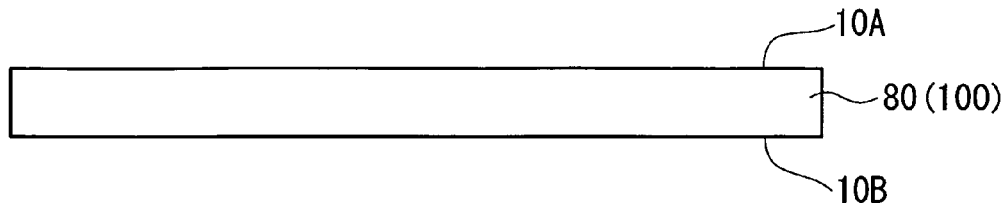
FIGS. 2A, 2B, 2C, 2D, and 2E are schematic representations of steps of burying conductive sections in a semiconductor element.
Figure 2B:
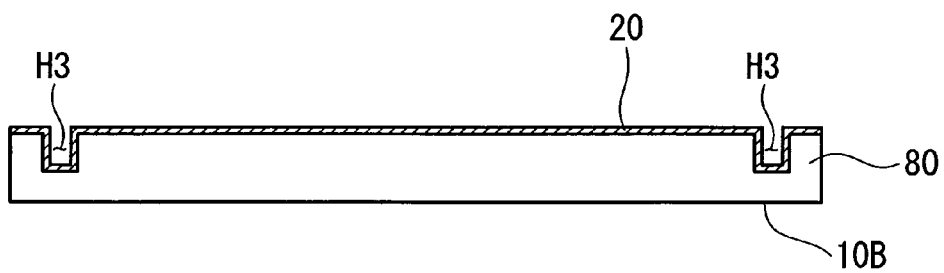

Next, as shown in FIG. 2B, holes H3 are formed in the active face 10A of the semiconductor element section 80. Steps of forming the holes H3 will be explained in detail with reference to FIGS. 3A to 5B.

Firstly, the top face of the passivation film 19 is completely coated with a resist (not shown) by a method such as spincoating, dipping, spraycoating, etc.

The passivation film 19 is coated with the resist and pre-baked. A mask of a predetermined pattern is then used to perform exposure and development processes, and the resist is patterned into the predetermined shape. The shape of the resist is set in accordance with the open shape of the electrode pad 16 and the cross-sectional shape of a hole in the semiconductor element section 80.

Figure 3B:
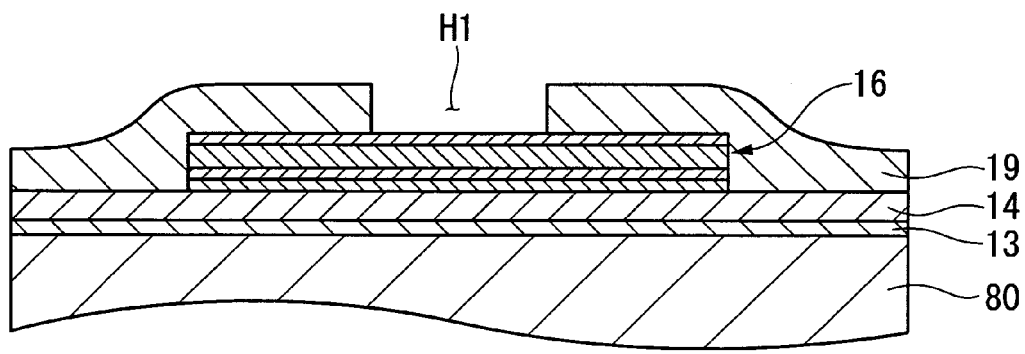

As shown in FIG. 3B, after patterning the resist and post-baking, an opening H1 is formed by dry etching or the like in part of the passivation film 19 which covers the electrode pad 16. The cross-sectional shape of the opening H1 is set in accordance with the open shape of the electrode pad 16 and the cross-sectional shape of a hole in the semiconductor element section 80, formed in a step explained below.

Figure 3C:
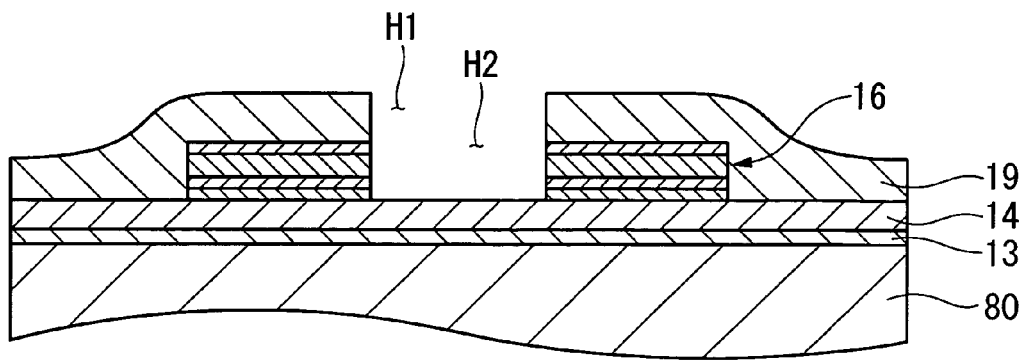

Using the resist on the passivation film 19 where the opening H1 is formed as a mask, the electrode pad 16 is opened by dry etching. FIG. 3C is a cross-sectional view of an opening H2 in the electrode pad 16. The resist is not shown in FIGS. 3A to 3C. As shown in FIG. 3C, the diameter of the opening H1 in the passivation film 19 is substantially the same as the diameter of the opening H2 in the electrode pad 16.

Figure 4A:
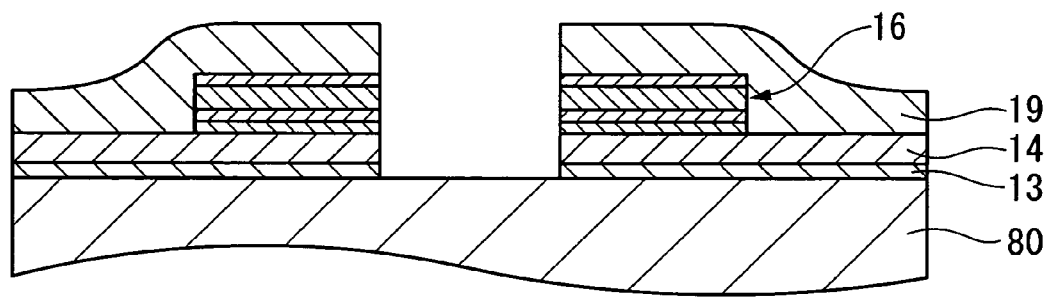
FIGS. 4A and 4B show steps of forming the conductive section subsequent to FIG. 3C.

The interlayer insulating film 14 and the insulating film 13 are then etched by using the resist which was used in the previous step as a mask, exposing part of the top face of the semiconductor element section 80, as shown in FIG. 4A. FIG. 4A is a cross-sectional view of the exposed part of the top face of the semiconductor element section 80 made by etching the interlayer insulating film 14 and the insulating film 13. The resist on the passivation film 19 which was used as the mask is then peeled away using a peeling solution, ashing, or the like.

Although the same resist is used in repeated etching steps during this process, it would be acceptable to repeatedly pattern the resist after the end of each etching step.

Figure 4B:
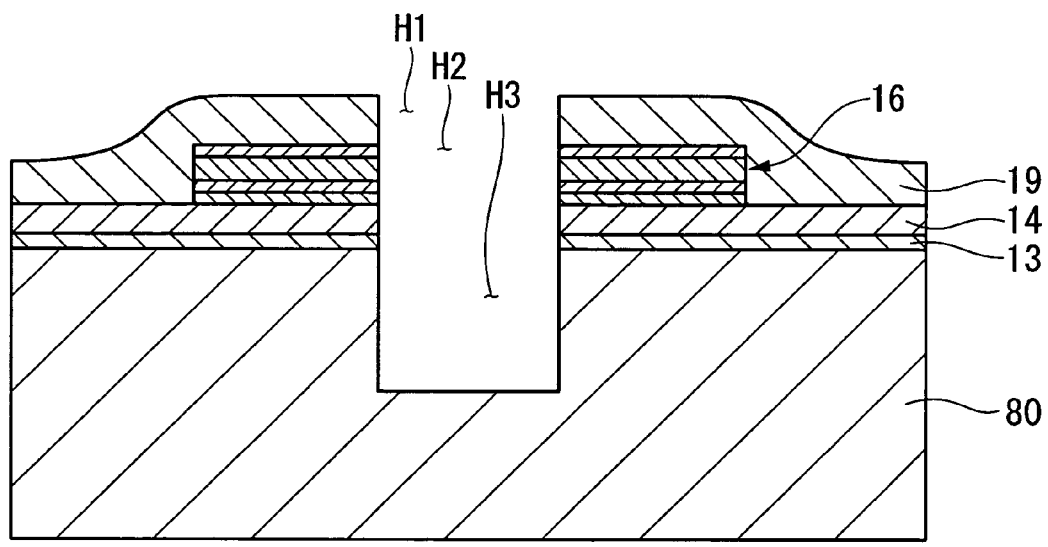

Using the passivation film 19 as a mask, the semiconductor element section 80 is perforated by dry etching as shown in FIG. 4B. In addition to RIE, inductively coupled plasma (ICP) can be used for the dry etching.

As shown in FIG. 4B, since the semiconductor element section 80 is perforated while using the passivation film 19 as a mask, the diameter of the hole H3 in the semiconductor element section 80 is substantially the same as the diameter of the opening H1 in the passivation film 19. That is, the diameter of the opening H1 in the passivation film 19, the diameter of the opening H2 in the electrode pad 16, and the diameter of the hole H3 in the semiconductor element section 80, are substantially the same. The depth of the hole H3 is set as appropriate in accordance with the thickness of the semiconductor chip which is formed last.

Figure 5A:
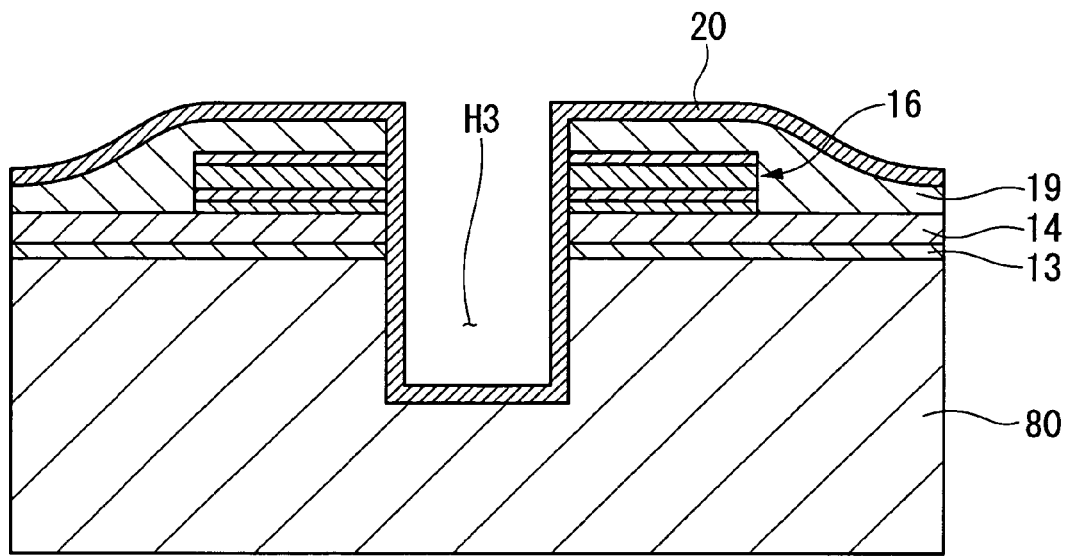
FIGS. 5A and 5B show steps of forming the conductive section subsequent to FIG. 4B.

As shown in FIG. 2B, an insulating film 20 is disposed over the passivation film 19, and over the inner walls and bottoms of the holes H3. FIG. 5A is a cross-sectional view of the insulating film 20 which is disposed over the passivation film 19, and over the inner walls and bottoms of the holes H3. The insulating film 20 is provided in order to prevent problems such as current leakage and corrosion of the semiconductor element section 80 due to oxygen and water and the like, and may consist of Tetra Ethyl Ortho Silicate ($Si(OC_2H_5)_4$: hereinafter TEOS) formed by plasma enhanced chemical vapor deposition (PECVD), i.e. PE-TEOS, TEOS formed by using ozone CVD ($O_3$-TEOS), or silicon oxide formed by using CVD, The top face of the passivation film 19 is then completely coated with a resist (not shown) by a method such as spincoating, dipping, or spraycoating.

After coating the passivation film 19 with the resist and pre-baking it, a mask of a predetermined pattern is used to perform exposure and development processes. The resist is patterned such that it remains only in areas other than on the electrode pad 16, in the holes H3, and the surrounding areas, e.g., in a ring-like shape centering around the holes H3.

After patterning the resist and post-baking, the passivation film 19 and the insulating film 20 which cover part of the electrode pad 16 are removed by, for example, dry etching, thereby opening part of the electrode pad 16. The fourth layer 16d of the electrode pad 16 is also removed at this time.

Figure 5B:
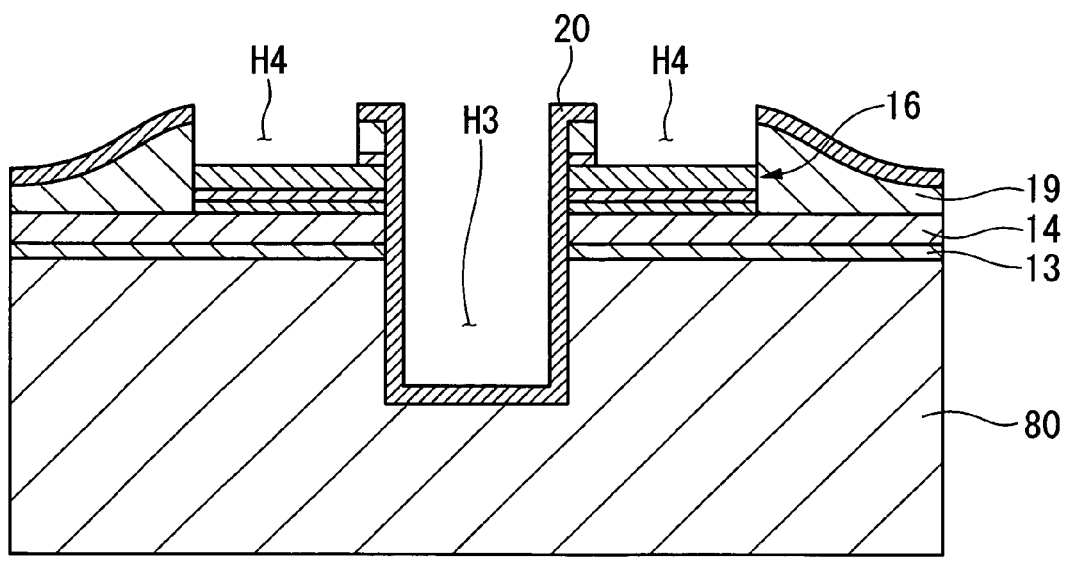

FIG. 5B is a cross-sectional view of the state when the passivation film 19 and the insulating film 20 which cover part of the electrode pad 16 are removed. As shown in FIG. 5B, holes H4 are formed above the electrode pad 16, and parts of the top face of the electrode pad 16 are exposed. The electrode pad 16 is connected through these holes H4 to penetrating electrodes (conductive sections) 24, which are formed in a subsequent step. The holes H4 may be formed at positions other than that of the hole H3, or adjacent to the hole H3.

Figure 6A:
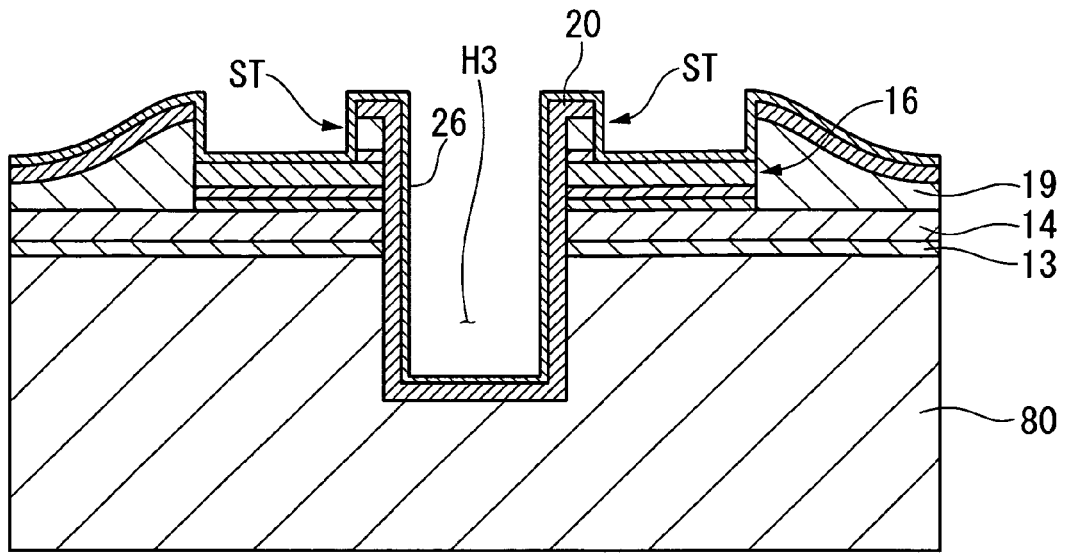
FIGS. 6A and 6B show steps of forming the conductive section subsequent to FIG. 5B.
Figure 7A:
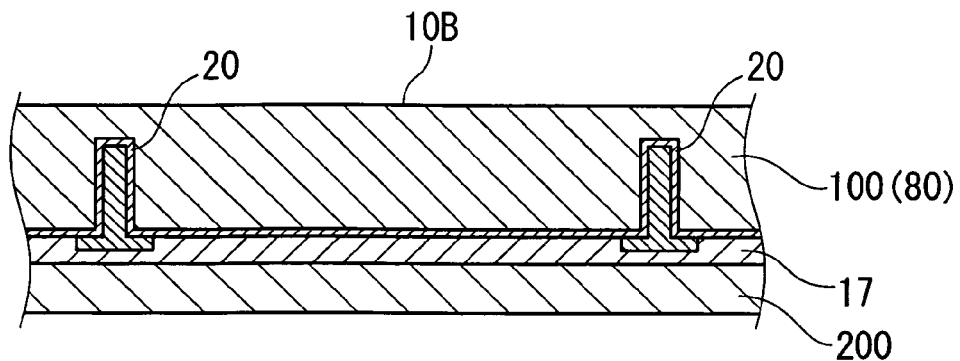
FIGS. 7A, 7B, and 7C show steps of forming a conductive section subsequent to FIG. 3C.
Figure 7B:
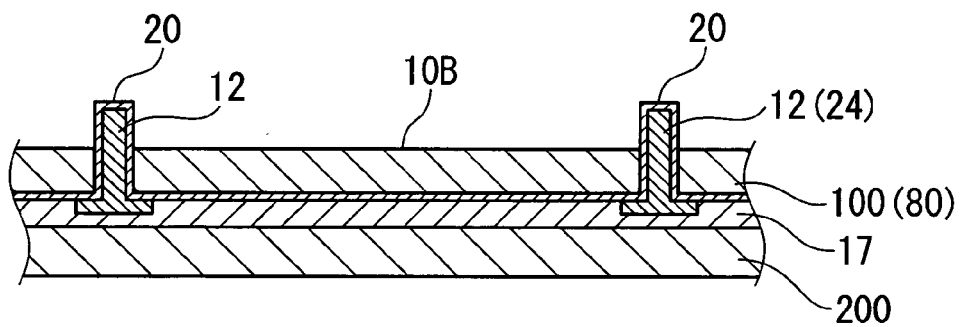
Figure 7C:
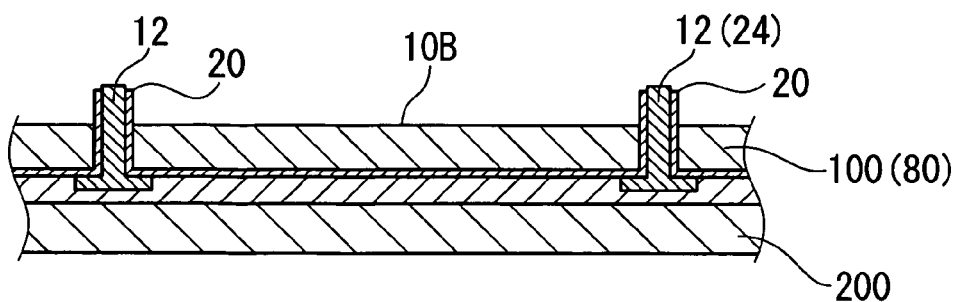

As shown in FIG. 6A, an underlayer 26 is disposed on the active face 10A of the semiconductor element section 80. The underlayer 26 is disposed on the entire top face of the semiconductor element section 80, and also on the exposed part of the electrode pad 16 and on the inner walls and bottom of the hole H3. Even if there is a step ST between the electrode pad 16 and the insulating film 20, the underlayer 26 is disposed continuously on the electrode pad 16 and the insulating film 20 (and in the hole H3) such that it covers the step ST. The underlayer 26 includes a barrier layer and a sheet layer. The barrier layer is formed first, and the sheet layer is formed on the barrier layer. The barrier layer consists of, for example, TiW, and the sheet layer consists of Cu. These layers are formed by, for example, ion metal plasma (IMP) deposition, vacuum evaporation, sputtering, or a physical vapor deposition (PVD) method such as ion plating.

Figure 2C:
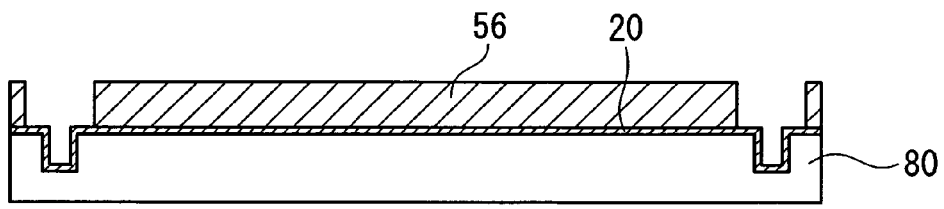
Figure 2D:
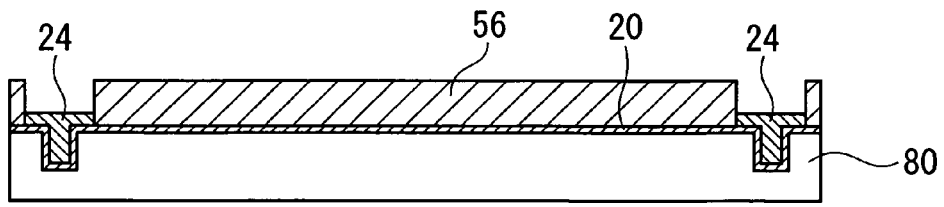

As shown in FIG. 2C, after forming the underlayer 26, the active face 10A of the semiconductor element section 80 is coated with a plating resist. In addition, patterning is performed to open sections for forming the conductive sections 24, forming a plating resist pattern 56. The underlayer 26 is not shown in FIGS. 2C to 2E. Copper (Cu) electrolytic plating is then performed, and, as shown in FIG. 2D, the conductive sections 24 are formed by burying a conductive material of Cu in the holes H3 of the semiconductor element section 80 and in the openings of the plating resist pattern 56.

Figure 2E:
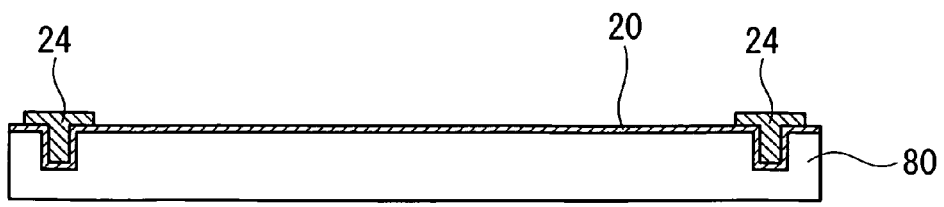

As shown in FIG. 2E, after forming the conductive sections 24, the plating resist pattern 56 is peeled away from the semiconductor element section 80. Since the underlayer 26 is conductive, in the state shown in FIG. 6A, all the conductive sections 24 formed on the semiconductor element 10 are made mutually conductive by the underlayer 26. Therefore, the individual conductive sections 24 become electrically insulated when the unwanted parts of the underlayer 26 are removed. The unwanted parts of the underlayer 26 are, for example, the parts which are exposed on the top face.

Figure 6B:
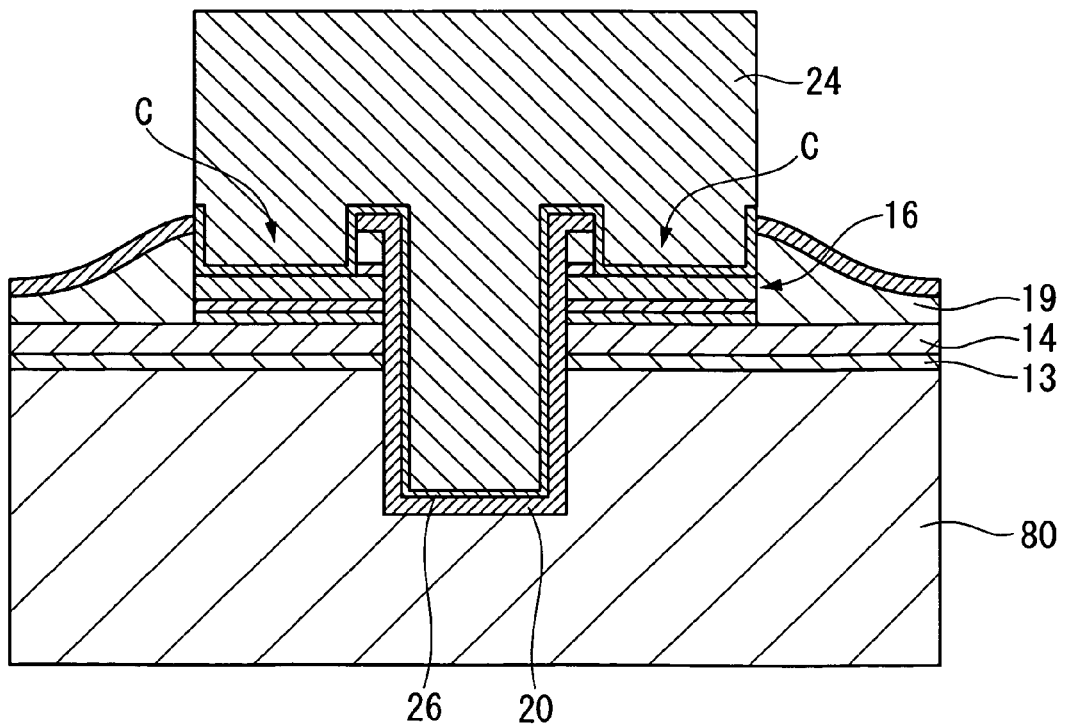

As shown in the cross-sectional view of the conductive section 24 in FIG. 6B, one part of the conductive section 24 protrudes from the active face 10A of the semiconductor element section 80 and another part is buried in the semiconductor element section 80. The conductive sections 24 are electrically connected to the electrode pad 16 at the positions indicated by the letter C in FIG. 6B.

Step of Thinning Semiconductor Wafer

As shown in FIG. 7A, a glass plate (support) 200 is pasted to the active face 10A of the silicon wafer 100 which includes the semiconductor element sections 80, with a UV (ultraviolet light) reactive adhesive layer 17 therebetween. Application of ultraviolet rays reduces the adhesion of the UV reactive adhesive layer 17 such that objects which stick to it can be peeled off. When the ultraviolet rays are applied from other side of the translucent glass plate 200 which supports the silicon wafer 100, the adhesive layer 17 reacts with the ultraviolet rays and its adhesion decreases, enabling the silicon wafer 100 to be easily peeled away from the glass plate 200.

The glass plate 200 is basically a wafer support system (WSS) which supports the silicon wafer 100. The silicon wafer 100 is pasted to the glass plate 200 and thinned by a predetermined method such as grinding, dry etching, or wet etching. Two or more of these processes may be performed together.

As shown in FIG. 7B, after the silicon wafer 100 is thinned, the ends of the conductive sections 24 covered by the insulating film 20 are exposed at the rear face 10B of the silicon wafer 100. As shown in FIG. 7C, the conductive sections 24 are exposed by removing the insulating film 20 by using a method such as dry etching. This forms the penetrating electrodes 12 which penetrate through the semiconductor elements 10 (semiconductor element sections 80) and protrude from the rear face 10B. As shown in FIG. 7C, the conductive areas of the penetrating electrodes 12 may be increased by exposing not only their ends but also parts of their side faces which lead to the ends.

By this step, the penetrating electrodes 12 are formed so as to protrude from the active face 10A and the rear face 10B of each semiconductor element section 80. This obtains a plurality of semiconductor devices 1 on one silicon wafer 100. In the explanation which follows, the section of the penetrating electrode 12 which protrudes from the active face 10A is termed a first electrode section 12A, and the section which protrudes from the rear face 10B is termed a second electrode section 12B.

Figure 8:
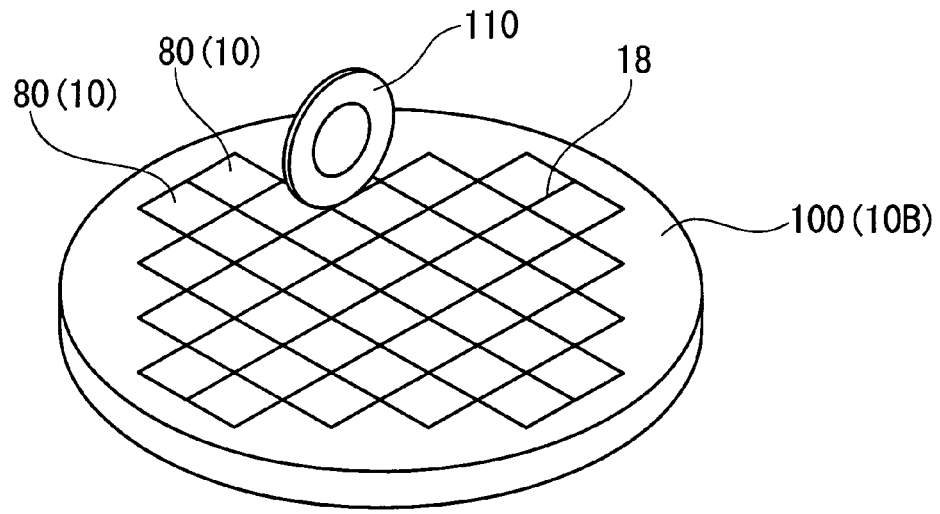
FIG. 8 shows a step of dicing a semiconductor wafer.

As shown in FIG. 8, after the penetrating electrodes 12 have been formed in the semiconductor element sections 80, a dicing plate 110 is used to dice (cut) the silicon wafer 100 from the rear face 10B to the active face 10A.

Dividing the silicon wafer 100 into each semiconductor element section 80 obtains a plurality of semiconductor elements 10. During cutting of the silicon wafer 100, when the dicing plate 110 reaches the adhesive layer 17 between the silicon wafer 100 and the glass plate 200, the dicing plate 110 is stopped moving in the depth direction. This avoids cutting the glass plate 200, since the tip of the dicing plate 110 is just in front of the glass plate 200. At this time, the semiconductor elements 10 divided by cutting with the dicing plate 110 remain held on the glass plate 200 with the adhesive layer 17 therebetween.

Figure 9A:
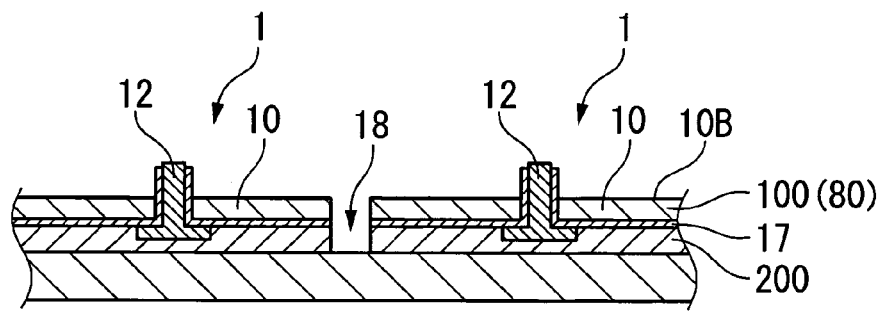
FIG. 9A is a cross-sectional view of a gap formed by dicing.

As shown in FIG. 9A, a gap 18 is formed between the divided semiconductor elements 10 and has the glass plate 200 as its bottom.

Figure 9B:
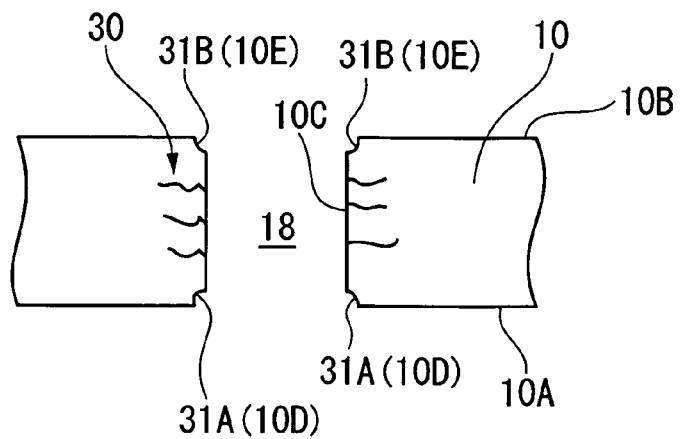
FIG. 9B is an enlarged view of the vicinity of the same gap.

FIG. 9B is an enlarged view of the vicinity of the gap 18 between the semiconductor elements 10.

As shown in FIG. 9B, when the silicon waver is cut by dicing, cracks 30 known as a fracture layer are generated in the side walls 10C of the separated semiconductor elements 100, and chips 31A and 31B known as chipping are generated at each corner of the side walls 10C of the semiconductor elements 10 (edge 10D on the active face 10A side of the semiconductor element 10 and edge 10E on the rear face 10B side). These cracks 30 and chips 31A and 31B cause the semiconductor elements 10 to break, and reduce their strength (e.g., transverse rupture strength).

With regard to the insertion direction of the dicing plate 110, the chip 31A at the corner 10D of the active face 10A (exit side) tends to be larger than the chip 31B at the corner 10E on the rear face 10B side (entrance side).

Figure 10A:
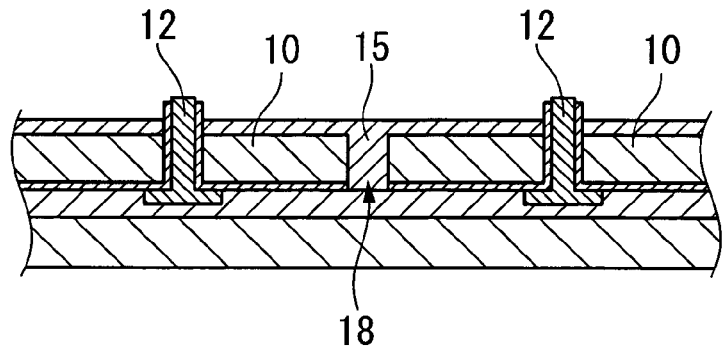
FIGS. 10A, 10B, and 10C show step diagrams of a semiconductor device subsequent to FIG. 9A.

Next, a thin coating of photosensitive resin is applied to the rear face 10B of the silicon wafer 10 (semiconductor elements 10) using a coater. In this coating step, for example, resin supplied from a nozzle is dripped onto the top face of the wafer, which is secured to a rotating support stand, and a uniform resin film is obtained by rotating the wafer at high speed. Consequently, as shown in FIG. 10A, a resin film 15 completely covers the rear face 10B of the silicon wafer 100 and is also buried in the gap 18.

As the photosensitive resin, rather than a negatype where the pattern of the part irradiated with light remains, it is more preferable to use a positive (e.g., photosensitive polyimide resin) where the irradiated part is removed in a subsequent development process.

Figure 10B:
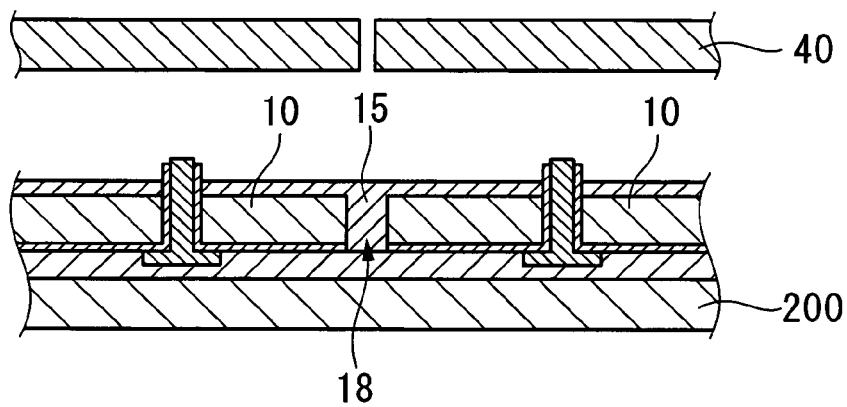

When using a positive photosensitive resin, only the portion of the resin layer buried in the gap 18 which is desired to be removed need be exposed to light. More specifically, as shown in FIG. 10B, after using an exposure mask 40 to expose the resin layer in the gap section between the semiconductor elements 10, the desired pattern is obtained by a development process. The exposure mask 40 has an opening which is narrower than the gap 18. The side walls 10C of the semiconductor elements 10 are difficult to expose, and need not be exposed. When using a negatype photosensitive resin, the exposed region is so large that it is difficult to apply exposure light uniformly over the resin layer 15.

Figure 10C:
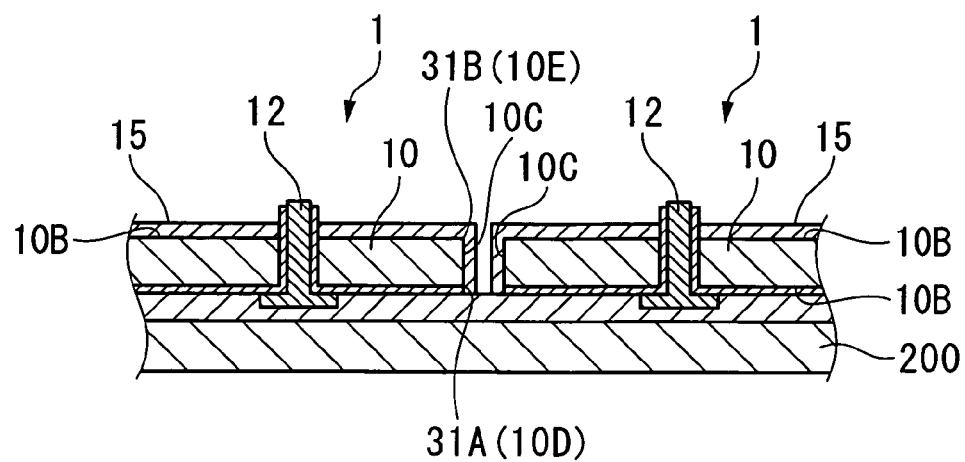

In the development process, for example, a developer is used to drip a strongly alkaline developing solution onto the rotating silicon wafer 100. The chemical structure of the region of the resin layer 15 which is exposed to light changes as it melts in the developing solution due to a photochemical reaction, and this region of the resin layer 15 is removed. As a result, as shown in FIG. 10C, the section of the resin layer 15 buried in the gap 18 is removed, splitting the resin layer 15. The resin layer 15 remains on the side walls 10C of the semiconductors element 10. That is, a plurality of resin layers 15 are formed covering on the side walls 10C and the corners 10D and 10E of each semiconductor element 10.

Figure 11A:
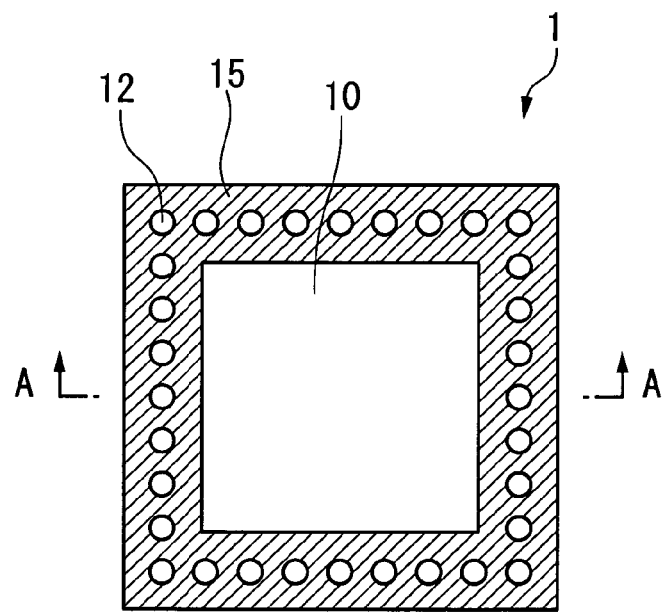
FIG. 11A is a plan view of a semiconductor device.

The side walls 10C of the semiconductor elements 10 divided from the silicon wafer 100 are covered by the resin layer 15. On the other hand, as shown in FIG. 11A, the resin layer 15 in the center of the rear face 10B of the semiconductor element 10 is removed by patterning. That is, the resin layer 15 selectively covers the periphery of the rear face 10B of the semiconductor element 10, including the side walls 10C, the corners 10D and 10E, and the periphery of the penetrating electrode 12.

Therefore, in addition to covering the cracks 30 generated in the side walls 10C of the semiconductor element 10 and the chips 31B generated in the corner 10E (edge) on the rear face 10B side (entrance side), the resin layer 15 also covers the chips 31A generated in the corner 10D (edge) of the active face 10A side of the semiconductor element 10.

Since the cracks and chips which cause breakage of the semiconductor elements 10 are covered by the resin layer 15, the strength of the semiconductor element 10 is increased.

Since the periphery of the penetrating electrode 12 in the rear face 10B of the semiconductor element 10 is covered by the resin layer 15, this avoids breakage caused by a through-hole 12H in the semiconductor element 10 and increases its strength.

Since the resin layer 15 partially covers the rear face 10B of the semiconductor element 10, the contraction stress which accompanies hardening of the resin layer 15 is reduced and there is less load on the semiconductor wafer than when the rear face of the semiconductor element 10 is completely covered by a resin layer.

Figure 11B:
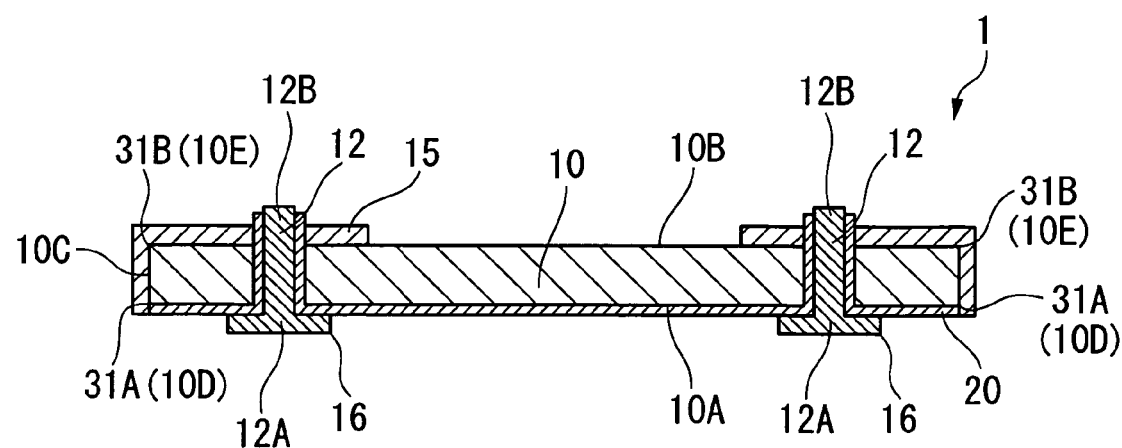
FIG. 11B is a cross-sectional view of the same semiconductor device.

The semiconductor element 10 is then peeled from the glass plate 200. Firstly, ultraviolet rays are applied to the adhesive layer 17 via the glass plate 200. The adhesion of the adhesive layer 17 decreases as it reacts to the ultraviolet rays, enabling the semiconductor element 10 to be easily peeled from the glass plate 200. As a result, as shown in FIGS. 11A and 11B, the semiconductor device 1 is obtained by separation of the semiconductor element 10 which includes the penetrating electrode 12. Since the semiconductor device 1 can be obtained with the silicon wafer 100 supported by the glass plate 200, there is no need to transfer the silicon wafer 100 to a dicing tape. That is, there is no need to re-paste the thin silicon wafer 100, simplifying the manufacture of the semiconductor device and making the silicon wafer 100 easier to handle.

According to the semiconductor device manufacturing method described above, the side walls 1OC and the corners 10D and 10E of the semiconductor element 10 where cracks and chips may cause the semiconductor element 10 to break are covered with the resin layer 15. This reinforces the semiconductor element 10 and prevents cracks or chips from spreading.

The periphery of the penetrating electrode 12 in the rear face 10B of the semiconductor element 10 is also covered with the resin layer 15. This prevents the hole H3, which functions as a through-hole of the semiconductor element 10, from causing the semiconductor element 10 to break.

Since the resin layer 15 covers only part of the rear face 10B of the semiconductor element 10, the contraction stress which accompanies hardening of the resin layer 15 is reduced and the load on the semiconductor wafer is lighter than when the rear face of the semiconductor element 10 is completely covered by a resin layer.

According to the semiconductor device manufacturing method described above, the partially applied resin layer 15 effectively reinforces the semiconductor element 10 and increases its strength. In other words, this manufacturing method makes it possible to manufacture the semiconductor device 1 having high strength and high reliability.

The present invention is not limited to the embodiment described above and can be modified in various ways. For example, with regard to the shape of the penetrating electrode 12, while in the above embodiment the size of the first electrode section 12A on the active face 10A side differs from the size of the second electrode section 12B on the rear face 10B side, the first electrode section 12A and the second electrode section 12B may have the same shape, it being possible to apply this invention in a semiconductor device which includes various types of penetrating electrodes.

Subsequently, the semiconductor device 1 obtained by the above manufacturing method will be explained.

FIG. 11A is a plane view of the semiconductor device 1. FIG. 11B is a side cross-sectional view of the semiconductor device 1 taken along the line A-A of FIG. 11A.

As shown in FIGS. 11A and 11B, the semiconductor device 1 includes the semiconductor element 10 which consists of a square element substrate, and a plurality of penetrating electrodes 12 provided in the semiconductor element 10. The semiconductor element 10 is made from silicon which is cut by dicing the silicon wafer 100 (semiconductor wafer). The semiconductor element 10 has an active face 10A, where an integrated circuit (not shown) consisting of a transistor, a memory element, and other electronic elements are attached, and a rear face 10B on the opposite side to the active face 10A.

The holes H3 for inserting the penetrating electrodes 12 are provided in the semiconductor element 10. The insulating film 20 is disposed in the holes H3 of the semiconductor element 10, and electrically insulates the penetrating electrodes 12 and the semiconductor element 10.

The penetrating electrodes 12 penetrate through the semiconductor element 10 and protrude from the active face 10A and the rear face 10B thereof.

As shown in FIG. 11A, the penetrating electrodes 12 are arranged along the four peripheral sides of the semiconductor element 10. The penetrating electrodes 12 may be arranged along only two opposite sides of the semiconductor element 10, or along one only side. It is also acceptable to provide only one penetrating electrode 12 through the semiconductor element 10.

Each penetrating electrode 12 is circular or rectangular (e.g., square) in plan view, and the electrode on the active face 10A side is larger than the one on the rear face 10B side.

Each penetrating electrode 12 includes an electrode pad 16, and is electrically connected to the integrated circuit on the semiconductor element 10. Electrical conduction between the active face 10A side and the rear face 10B side of the semiconductor element 10 is possible via the penetrating electrode 12.

On the rear face 10B of the semiconductor element 10, the resin layer 15 is disposed such that it selectively covers the side walls 10C and the corners 10D and 10E of the semiconductor element 10, and the peripheral areas of the rear face 10B of the semiconductor element 10 including the periphery of the penetrating electrodes 12.

The resin layer 15 does not cover the center of the semiconductor element 10 where there are no penetrating electrodes 12. The contraction pressure when the resin layer 15 hardens is lower than if the resin layer 15 covered the entire rear face 10B of the semiconductor element 10.

As shown in FIG. 11B, the resin layer 15 consists of photosensitive polyimide or the like, and continuously covers the semiconductor element 10 from the periphery of the penetrating electrodes 12 to the edge of the semiconductor element 10 on the rear face 10B side, and from the side wall 10C of the semiconductor element 10 to the edge of the semiconductor element 10 on the active face 10A side. The resin layer 15 is also firmly applied over the sides of the penetrating electrodes 12 which protrude from the rear face 10B.

According to the semiconductor device 1, since the resin layer 15 covers the peripheries of the penetrating electrodes (second electrode sections 12B) 12 which protrude from the rear face 10B of the semiconductor element 10, the holes H3 provided in the semiconductor element 10 are prevented from causing the semiconductor element 10 to break, increasing the strength of the semiconductor element 10 which includes the penetrating electrodes 12.

Since the resin layer 15 selectively reinforces the side walls 10C and the corner 10D and 10E of the semiconductor device 1, chips and cracks which occur in the side walls 10C or the corners 10D and 10E during separation are prevented from spreading and the strength is increased.

The contraction pressure which accompanies hardening of the resin layer 15 is lower, and the load on the semiconductor element 10 is lighter, than when the semiconductor element 10 is completely covered by a resin layer.

Figure 12:
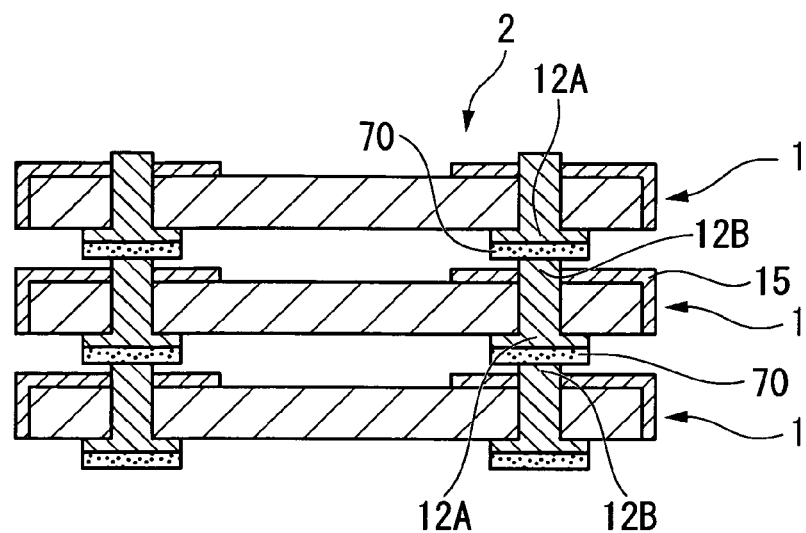
FIG. 12 is a side cross-sectional view of one example of a laminated body.

Subsequently, a laminated semiconductor device 2 which includes a plurality of the abovementioned semiconductor devices 1 will be explained. FIG. 12 is a schematic cross-sectional view of this laminated semiconductor device 2.

As shown in FIG. 12, the laminated semiconductor device 2 includes a plurality of the semiconductor devices 1 which are laminated together. Specifically, a second semiconductor device 1 is disposed on a first semiconductor device 1, and a third semiconductor device 1 is disposed on the second semiconductor device 1. An electrode (second electrode section 12B) on the rear face side of the first semiconductor device 1 is connected to an electrode (first electrode section 12A) on the active face side of the second semiconductor device 1 via a soldered layer 70. Similarly, an electrode (second electrode section 12B) on the rear face side of the second semiconductor device 1 is connected to an electrode (first electrode section 12A) on the active face side of the third semiconductor device 1 via a soldered layer 70

The semiconductor devices 1 can be laminated by a method such as using a bonding tool which has a heat source to join the semiconductor devices 1 together by melting and solidifying (hardening) the soldered layer 70. The strength of the laminated semiconductor device 2 can be increased by providing an insulating underfill (not shown) between the semiconductor devices 1

The semiconductor devices 1 may be laminated one by one, or jointly by using a reflow device or the like.

While there are cases where the soldered layer 70 melts and flows while the semiconductor devices 1 are being laminated, direct contact between the soldered layer 70 and the silicon of the semiconductor elements 10 is prevented by covering the peripheries of the penetrating electrodes (second electrode sections 12B) 12 with the resin layer 15, thereby avoiding electrical problems such as short-circuits.

According to the laminated semiconductor device 2 described above, reliability is increased due to the high strength of the semiconductor device 1.

The laminated semiconductor device of this invention is not limited to one in which a plurality of the semiconductor devices 1 are laminated, and can also be applied when, for example, another semiconductor chip or the like is laminated on the semiconductor device 1.

Figure 13:
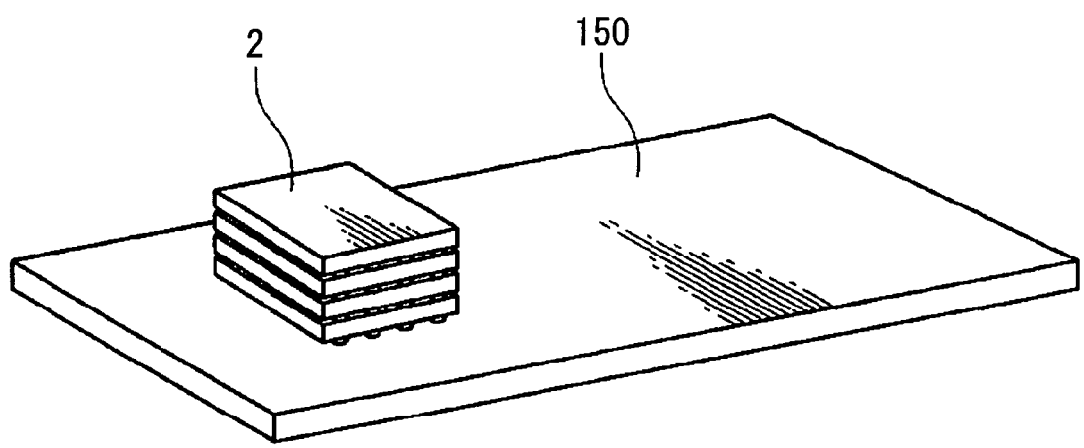
FIG. 13 is a perspective view of one example of a circuit substrate.

Subsequently, a circuit substrate which includes the semiconductor device 1 will be explained. FIG. 13 is a perspective view of the schematic configuration of a circuit substrate.

As shown in FIG. 13, a laminated structure (laminated semiconductor device) 2 is obtained by laminating a plurality of the semiconductor devices 1 (see FIG. 12) and then laminating another semiconductor chip on the semiconductor devices 1. The laminated structure 2 is disposed on a circuit substrate 150.

The circuit substrate 150 includes an organic substrate such as a glass epoxy substrate, and, in addition to the laminated structure 2, also includes an interconnection pattern of copper and the like (not shown) and an electrode pad (not shown). The laminated structure 2 and the electrode pad are electrically connected, and the laminated structure 2 is mounted on the circuit substrate 150.

According to the circuit substrate 150, the highly reliable laminated structure 2 ensures that the circuit substrate 150 is strong and highly reliable.

Figure 14:
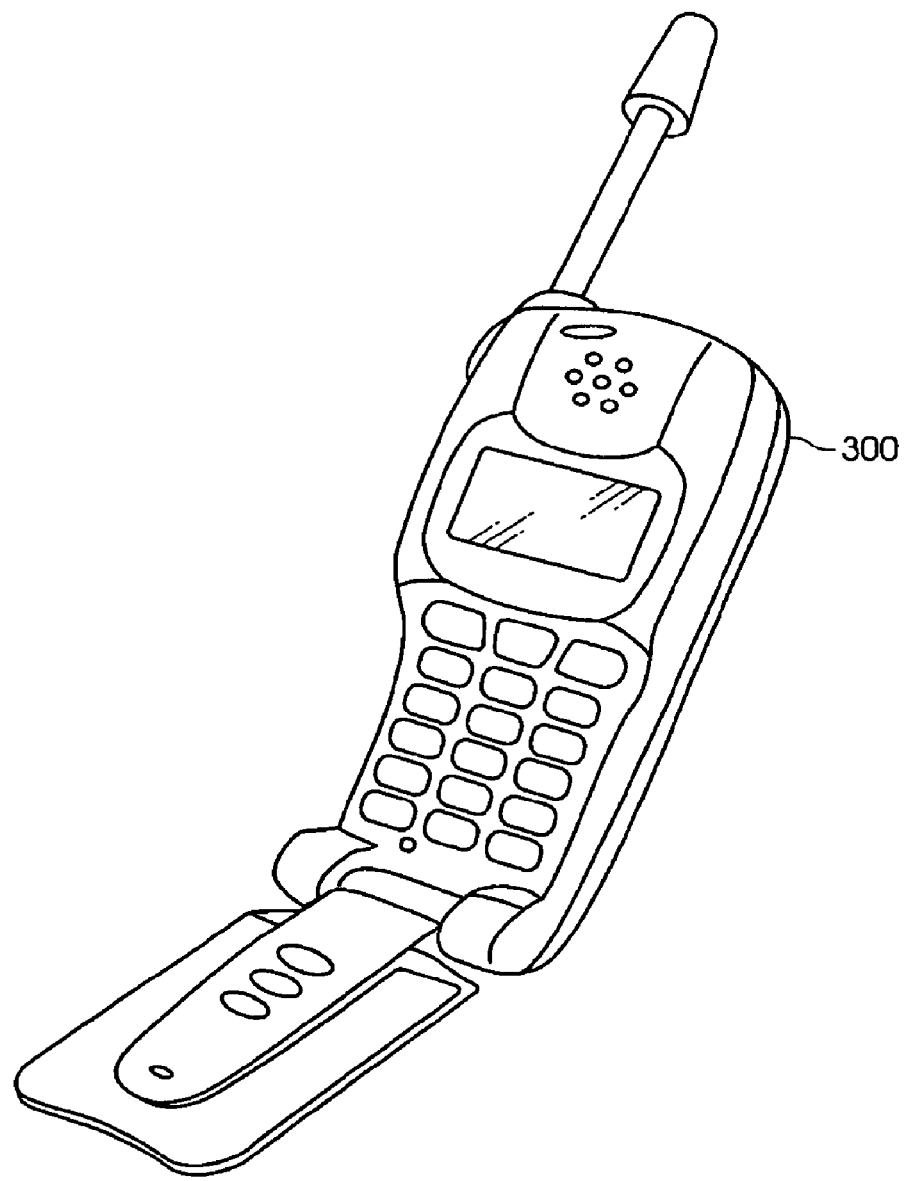
FIG. 14 is a perspective view of one example of an electronic apparatus.

Subsequently, an electronic apparatus will be explained. FIG. 14 is a diagram of a mobile telephone 300 as an example of an electronic apparatus according to an embodiment of this invention. The circuit substrate 150 is incorporated in the mobile telephone 300.

According to the mobile telephone 300 of this configuration, the circuit substrate 150 ensures that the mobile telephone 300 is strong and highly reliable.

The electronic apparatus of this invention is not limited to the mobile telephone 300, and can be applied in various types of electronic apparatuses such as liquid crystal projectors, personal computers (PC) and engineering workstations (EWS) with multimedia functions, pagers, word processors, televisions, viewfinder type/direct-view monitor type video tape recorders, electronic notebooks, electronic calculators, car navigation devices, POS terminals, and devices with touch panels.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A semiconductor device manufacturing method comprising:
    affixing a semiconductor wafer, which includes a plurality of semiconductor element sections which a conductive material is buried in, to a supporting body via an adhesive layer;
    forming a penetrating electrode which penetrates the plurality of semiconductor element sections and has the conductive material, by thinning the semiconductor wafer;

cutting the semiconductor wafer so that the supporting body remains, and dividing the semiconductor wafer into the plurality of semiconductor element sections;

forming a resin layer after the cutting of the semiconductor wafer, the resin layer selectively covering side walls and corners of the plurality of semiconductor element sections formed by cutting the semiconductor wafer; and peeling the semiconductor element sections from the supporting body after the forming of the resin layer.

2. The semiconductor device manufacturing method according to claim 1, wherein the forming of the resin layer has:

applying resin in selective regions on the semiconductor wafer which include gaps between the plurality of semiconductor elements formed by cutting the semiconductor wafer; and splitting the resin which is buried in the gaps so that the supporting body remains.

3. The semiconductor device manufacturing method according to claim 2, wherein, in the splitting of the resin, the resin layer has a positive photosensitive resin which is exposed and developed.

4. The semiconductor device manufacturing method according to claim 1, wherein the resin layer additionally covers a periphery of the penetrating electrode, the resin layer partially covers a surface of the semiconductor element section, the surface including an area in which the penetrating electrode is buried.

5. The semiconductor device manufacturing method according to claim 1, wherein, in the peeling the semiconductor element sections, ultraviolet rays which reduce the adhesion of the adhesive layer are applied to the adhesive layer.

* * * * *